(12) United States Patent
Fukutome

(10) Patent No.: US 10,332,878 B2
(45) Date of Patent: Jun. 25, 2019

(54) SEMICONDUCTOR DEVICE WITH IMPURITY-DOPED REGION AND METHOD OF FABRICATING THE SAME

(71) Applicant: Samsung Electronics Co., Ltd., Suwon-si (KR)

(72) Inventor: Hidenobu Fukutome, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/398,087

(22) Filed: Jan. 4, 2017

(65) Prior Publication Data

US 2017/0117278 A1   Apr. 27, 2017

Related U.S. Application Data

(63) Continuation of application No. 13/803,799, filed on Mar. 14, 2013, now Pat. No. 9,559,101.

(30) Foreign Application Priority Data

Jun. 22, 2012   (KR) .......................... 10-2012-0067493

(51) Int. Cl.

| H01L 23/48 | (2006.01) |
|---|---|
| H01L 23/52 | (2006.01) |
| H01L 29/40 | (2006.01) |
| H01L 27/088 | (2006.01) |
| H01L 27/092 | (2006.01) |
| G11C 11/40 | (2006.01) |

(Continued)

(52) U.S. Cl.
CPC .......... *H01L 27/0886* (2013.01); *G11C 11/40* (2013.01); *H01L 21/823807* (2013.01); *H01L 21/823814* (2013.01); *H01L 21/823821* (2013.01); *H01L 21/823871* (2013.01); *H01L 27/092* (2013.01); *H01L 27/0922* (2013.01); *H01L 27/0924* (2013.01); *H01L 29/0649* (2013.01)

(58) Field of Classification Search
CPC ..... H01L 21/823807; H01L 21/823814; H01L 21/823821; H01L 21/823871; H01L 27/0886; H01L 27/0922; H01L 27/0924; H01L 29/0649
USPC ......................................... 257/774
See application file for complete search history.

(56) References Cited

U.S. PATENT DOCUMENTS

| 6,159,872 A | 12/2000 | Essaian et al. |
|---|---|---|
| 6,297,106 B1 | 10/2001 | Pan et al. |
| 6,365,972 B1 | 4/2002 | Jun |

(Continued)

FOREIGN PATENT DOCUMENTS

| JP | 07183254 | 7/1995 |
|---|---|---|
| JP | 11307773 | 11/1999 |

(Continued)

OTHER PUBLICATIONS

Korean Office Action dated Jun. 20, 2018, issued in the corresponding Korean Application No. 10-2012-0067493.

*Primary Examiner* — Duy T Nguyen
(74) *Attorney, Agent, or Firm* — Onello & Mello, LLP

(57) ABSTRACT

A semiconductor device includes an interlayer insulating film formed on a substrate, a plurality of contacts formed in the interlayer insulating film, and an impurity-doped region formed around the contacts in the interlayer insulating film and along a lengthwise direction of the contacts.

17 Claims, 19 Drawing Sheets

(51) Int. Cl.
*H01L 21/8238* (2006.01)
*H01L 29/06* (2006.01)

(56) References Cited

U.S. PATENT DOCUMENTS

| | | |
|---|---|---|
| 6,610,594 B2 | 8/2003 | Apelgren et al. |
| 6,720,213 B1 | 4/2004 | Gambino et al. |
| 2005/0186722 A1 | 8/2005 | Cheng et al. |
| 2006/0186484 A1* | 8/2006 | Chau ............... H01L 29/66628 257/401 |
| 2008/0265294 A1 | 10/2008 | Ikeda |
| 2009/0159987 A1 | 6/2009 | Oh |
| 2010/0233864 A1 | 9/2010 | Lee et al. |
| 2011/0001181 A1 | 1/2011 | Ju |

FOREIGN PATENT DOCUMENTS

| | | |
|---|---|---|
| JP | 2001267418 | 9/2001 |
| JP | 2004134617 | 4/2004 |
| JP | 2006165330 | 6/2006 |
| KR | 1998038844 | 8/1998 |
| KR | 1020010090318 | 10/2001 |
| KR | 20070068878 | 7/2007 |
| KR | 20100001917 | 1/2010 |
| KR | 1020110123634 | 1/2011 |
| KR | 1020120048818 | 5/2012 |

\* cited by examiner

SEMICONDUCTOR DEVICE WITH IMPURITY-DOPED REGION AND METHOD OF FABRICATING THE SAME

This application is a divisional application of U.S. patent application Ser. No. 13/803,799 filed on Mar. 14, 2013, now U.S. Pat. No. 9,559,101, issued on Jan. 31, 2017, which claims priority from Korean Patent Application No. 10-2012-0067493, filed on Jun. 22, 2012, in the Korean Intellectual Property Office, the disclosure of which is incorporated herein by reference in its entirety.

BACKGROUND

1. Field of the Inventive Concepts

The present inventive concepts relate to a semiconductor device and a method of fabricating the same.

2. Description of the Related Art

As semiconductor devices become smaller, significant reductions are being seen in the distance between gate electrodes, the distance between contacts, or the distance between a gate electrode and a contact.

To enhance electrical characteristics of a small-sized semiconductor device, an insulating film having a high dielectric constant may be used as a spacer of a gate electrode or an etch stop film.

Consequently, the parasitic capacitance between gate electrodes, between contacts or between a gate and a contact may be large. The large parasitic capacitance may cause an operation error and may deteriorate the electrical characteristics of the device.

SUMMARY

Aspects of the present inventive concepts provide a semiconductor device having a dielectric constant that minimizes parasitic capacitance.

Aspects of the present inventive concepts also provide a method of fabricating a semiconductor device having a dielectric constant that minimizes parasitic capacitance.

Aspects of the present inventive concepts, however, are not restricted to those set forth herein. The above and other aspects of the present inventive concepts will become more apparent to one of ordinary skill in the art to which the present inventive concepts pertain by referencing the detailed description of the present inventive concepts, provided below.

According to an aspect of the present inventive concepts, there is provided a semiconductor device comprising an interlayer insulating film formed on a substrate, a plurality of contacts formed in the interlayer insulating film, and an impurity-doped region formed around the contacts in the interlayer insulating film and along a lengthwise direction of the contacts.

In various embodiments, the impurity-doped region may include at least fluorine and/or carbon. The interlayer insulating film may include the impurity-doped region and an undoped region, wherein a dielectric constant of the impurity-doped region is smaller than that of the undoped region. The contacts may include a first contact and a second contact that are adjacent to each other, wherein the impurity-doped region comprises a first impurity-doped region formed along a lengthwise direction of the first contact and a second impurity-doped region formed along a lengthwise direction of the second contact, and the undoped region is located between the first impurity-doped region and the second impurity-doped region. The impurity-doped region may further include a third impurity-doped region formed on a surface of the interlayer insulating film, wherein the undoped region is surrounded by the first impurity-doped region, the second impurity-doped region, and the third impurity-doped region. The device may further include a gate electrode formed on the substrate and located within the undoped region. The gate electrode may be a gate of a p-channel metal oxide semiconductor (PMOS) transistor, and each of the first contact and the second contact may be connected to a source/drain of the PMOS transistor. The device may further include an element isolation region formed directly under the undoped region.

According to another aspect of the present inventive concepts, there is provided a semiconductor device comprising a substrate having a defined first region and a defined second region. A first gate electrode and a first contact are formed in the first region and separated from each other by a first horizontal distance. A second gate electrode and a second contact are formed in the second region and separated from each other by a second horizontal distance. Additionally, an interlayer insulating film is formed on the substrate to cover the first gate electrode, the first contact, the second gate electrode, and the second contact; and a first impurity-doped region is formed around the first contact in the interlayer insulating film and along a lengthwise direction of the first contact.

In various embodiments, The impurity-doped region may again include fluorine and/or carbon. The fluorine or the carbon may be undoped around the second contact in the interlayer insulating film and along a lengthwise direction of the second contact. A PMOS transistor may be formed in the first region, and an n-channel metal oxide semiconductor (NMOS) transistor may be formed in the second region. The fluorine or the carbon may b further doped along a surface of the interlayer insulating film. The second horizontal distance (separating the second gate electrode and the second contact in the second defined region) may be greater than the first horizontal distance (separating the first gate electrode and the first contact in the first defined region). The device may further include a second impurity-doped region formed around the second contact in the interlayer insulating film and along the lengthwise direction of the second contact.

According to another aspect of the present inventive concepts, there is provided an electronic system, comprising a bus for data transfer; a controller in communication with the bus; an input/output device in communication with the bus; a memory device in communication with the bus; and a communication interface in communication with the bus, wherein at least one of the memory device, the controller and the input/output device includes a semiconductor device, as described above.

In various embodiments, the controller may includes at least one of a microprocessor, a digital signal processor, a microcontroller, and logic elements. The input/output device may include at least one of a keypad, a keyboard, and a display device. The memory device may be configured to store at least one of data and commands. The communication interface may be an antenna, a wired transceiver, or a wireless transceiver.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF THE EMBODIMENTS

Figure 1:
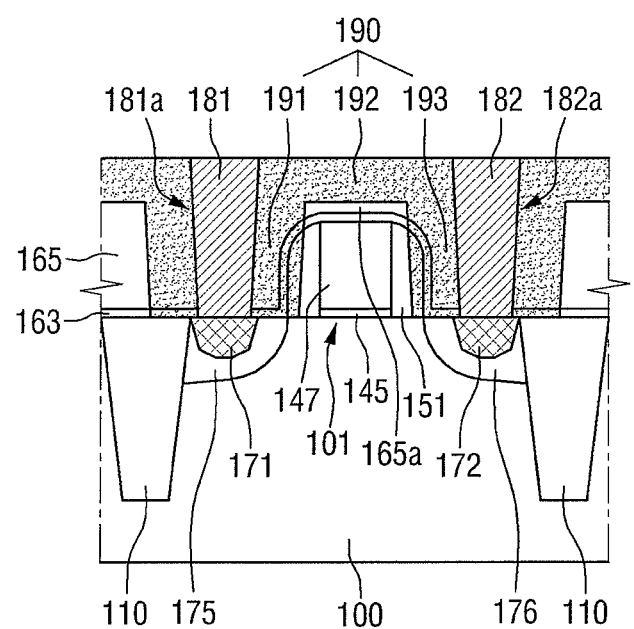
FIG. 1 is a cross-sectional view of a semiconductor device 1 according to a first embodiment of the present inventive concepts.

The present inventive concepts will now be described more fully hereinafter with reference to the accompanying drawings, in which preferred embodiments of the inventive concepts are shown. These inventive concepts may, however, be embodied in different forms and should not be construed as limited to the embodiments set forth herein. Rather, these embodiments are provided so that this disclosure will be thorough and complete, and will fully convey exemplary details of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural forms, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art to which these inventive concepts belong. It is noted that the use of any and all examples, or exemplary terms provided herein is intended merely to better illuminate embodiments of the inventive concepts and is not a limitation on the scope of the inventive concepts unless otherwise specified. Further, unless defined otherwise, all terms defined in generally used dictionaries may not be overly rigidly interpreted.

The present inventive concepts will be described with reference to perspective views, cross-sectional views, and/or plan views, in which preferred embodiments of the inventive concepts are shown. Thus, the profile of an exemplary view may be modified according to manufacturing techniques and/or allowances. That is, the embodiments of the inventive concepts are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

FIG. 1 is a cross-sectional view of a semiconductor device 1 according to a first embodiment of the present inventive concepts. The semiconductor device 1 according to the first embodiment of the present inventive concepts includes a substrate 100, a transistor 101, a plurality of contacts 181 and 182, an interlayer insulating film 165, an impurity-doped region 190, and the like.

The substrate 100 may be made of one or more semiconductor materials selected from Si, Ge, SiGe, GaP, GaAs, SiC, SiGeC, InAs, and InP. In addition, a silicon-on-insulator (SOI) substrate can be used. Alternatively, the substrate 100 may be a rigid substrate such as a glass substrate for displays or may be a flexible plastic substrate, such as polyimide, polyester, polycarbonate, polyethersulfone, polymethylmethacrylate, polyethylene naphthalate or polyethyleneterephthalate.

An element isolation region 110 may be formed in the substrate 100 to define an active region. As shown in the drawing, the element isolation region 110 may be, but is not limited to, a shallow trench isolation (STI) region.

The transistor 101 may include a gate insulating film 145, a gate electrode 147, a spacer 151, source/drain regions 175 and 176, silicides 171 and 172, and the like.

The gate electrode 147 may be, but is not limited to, a single film of poly-Si; poly-SiGe; poly-Si doped with impurities; metal, such as Ta, TaN, TaSiN, TiN, TiC, TaC, Mo, Ru, Ni, NiSi, W or Al, or metal silicide; or a stacked film of these materials.

The gate insulating film 145 may be made of a silicon oxide film, a silicon nitride film, SiON, GexOyNz, GexSiyOz, a high-k material, a combination of these materials, or a sequential stack of these materials. Examples of the high-k material may include, but are not limited to, $HfO_2$, $ZrO_2$, $Al_2O_3$, $Ta_2O_5$, hafnium silicate, zirconium silicate, and a combined film of these materials.

In the drawing of FIG. 1, a gate first structure is shown as an example. The present inventive concepts, however, are not limited to this example. That is, in the drawing, the gate insulating film 145 is located only on a bottom surface of the gate electrode 147. However, the present inventive concepts are not limited thereto. For example, a gate last structure can be employed. In this case, the gate insulating film 145 may be conformally formed along the bottom surface and sidewalls of the gate electrode 147.

The spacer 151 may be formed on the sidewalls of the gate electrode 147 and may include at least one of $SiO_2$, SiN, SiON, and a low-k material (such as SiOF, SiOC, etc.).

The source/drain regions 175 and 176 are located in the substrate 100 on both sides of the gate electrode 147. The source/drain regions 175 and 176 can have any shape. For example, the source/drain regions 175 and 176 may have a lightly-doped drain (LDD) structure, a double-diffused drain (DDD) structure, a mask-islanded double-diffused drain (MIDDD) structure, a mask LDD (MLDD) structure, or a lateral double-diffused MOS (LDMOS) structure.

Unlike the illustration of FIG. 1, the source/drain regions 175 and 176 may be elevated source/drain regions. In this case, top surfaces of the source/drain regions 175 and 176 may be higher than a top surface of the substrate 100. The source/drain regions 175 and 176 may be formed by forming recesses on both sides of the gate electrode 147 and performing an epitaxial process on the recesses. The source/drain regions 175 and 176 may include SiGe or SiC.

The silicides 171 and 172 may be formed within the source/drain regions 175 and 176, respectively. The silicides 171 and 172 may include, but not limited to, at least one of NiPtSi, NiSi, CoSi, and TiSi.

As shown in the drawing, the silicides 171 and 172 may not be overlapped by the spacer 151. As will be described later, after contact holes 181a and 182a are formed, the silicides 171 and 172 may be formed in portions of the source/drain regions 175 and 176 which are exposed by the contact holes 181a and 182a.

The contacts 181 and 182 are formed on the substrate 100 to be connected to the source/drain regions 175 and 176. The contacts 181 and 182 may be made of a material such as Cu, W, or Al.

Although not shown in the drawing, a barrier film may be formed around each of the contacts 181 and 182. That is, the barrier film may be conformally formed along sidewalls and a bottom surface of each of the contact holes 181a and 182a. The barrier film may include, but not limited to, Ti/TiN.

The interlayer insulating film 165 may be formed on the substrate 100 to cover the transistor 101 and the contacts 181 and 182. The interlayer insulating film 165 may include at least one of $SiO_2$, SiN, SiON, and a low-k material (such as SiOF, SiOC, or the like). Before the interlayer insulating film 165 is formed, an etch stop film 163 may be formed. The etch stop film 163 may be, but is not limited to, a silicon nitride film.

The impurity-doped region 190 may be formed around the contacts 181 and 182 in the interlayer insulating film 165 and along a lengthwise direction of the contacts 181 and 182. The impurity-doped region 190 may include at least one of fluorine (F) and carbon (C).

As shown in FIG. 1, the contacts 181 and 182 include a first contact 181 and a second contact 182, which are adjacent to each other. When the first contact 181 and the second contact 182 are characterized as being adjacent to each other, it means that no other contacts are present between the first contact 181 and the second contact 182.

The impurity-doped region 190 includes a first impurity-doped region 191 formed along a lengthwise direction of the first contact 181 and a second impurity-doped region 193 formed along a lengthwise direction of the second contact 182. The impurity-doped region 190 may further include a third impurity-doped region 192 formed on a surface of the interlayer insulating film 165.

An undoped region 165a may be located between the first impurity-doped region 191 and the second impurity-doped region 193. More specifically, the undoped region 165a may be a region surrounded by the first impurity-doped region 191, the second impurity-doped region 193, and the third impurity-doped region 192. In FIG. 1, the undoped region 165a is a region of the interlayer insulating film 165 excluding the impurity-doped region 190. The gate electrode 147 may be located within the undoped region 165a.

In particular, a dielectric constant of the impurity-doped region 190 may be smaller than that of the undoped region 165a. If a region of the interlayer insulating film 165 is doped with impurities, such as fluorine or carbon, a dielectric constant of the impurity-doped region is reduced.

As the semiconductor device 1 becomes smaller, a distance between gate electrodes 147, a distance between contacts (e.g., between contacts 181 and 182), and a distance between a gate electrode 147 and a contact 181 or 182 are being reduced significantly.

To improve electrical characteristics of the small-sized semiconductor device 1, a silicon nitride film may be used as the spacer 151 of the gate electrode 147 or the etch stop film 163. The silicon nitride film has a relatively higher dielectric constant than a silicon oxide film.

For example, if the distance between the gate electrode 147 and the contact 181 or 182 is reduced and if a silicon nitride film having a high dielectric constant is used as an insulating material between the gate electrode 147 and the contact 181 or 182, parasitic capacitance between the gate electrode 147 and the contact 181 or 182 may be large. The large parasitic capacitance may cause an operation error and may deteriorate the electrical characteristics.

In the semiconductor device 1 according to the first embodiment, however, the impurity-doped region 190 is formed along the lengthwise direction of the contacts 181 and 182. That is, the insulating material (i.e., the spacer 151, the etch stop film 163, the interlayer insulating film 165, etc.) between the gate electrode 147 and the contact 181 or 182 is doped with impurities, such as fluorine or carbon. As described above, if a region of the interlayer insulating film 165 is doped with impurities, such as fluorine or carbon, the dielectric constant of the impurity-doped region is reduced. Therefore, the parasitic capacitance between the gate electrode 147 and the contact 181 or 182 can be reduced.

The transistor 101 may be a p-channel metal oxide semiconductor (PMOS) transistor. The impurity-doped region 190 can also be formed simultaneously in the source/drain regions 175 and 176 (or the silicides 171 and 172) by controlling conditions. This method makes it possible to modulate silicide characteristics. Using fluorine to form the impurity-doped region 190 may affect the silicides 171 and 172. The fluorine used to dope the silicides 171 and 172 (e.g., NiSi) may favorably effect work functions of the silicides 171 and 172. That is, the fluorine may improve an ohmic contact function of the silicides 171 and 172. The silicides 171 and 172 may be formed before the impurity-doped region 190.

Figure 2:
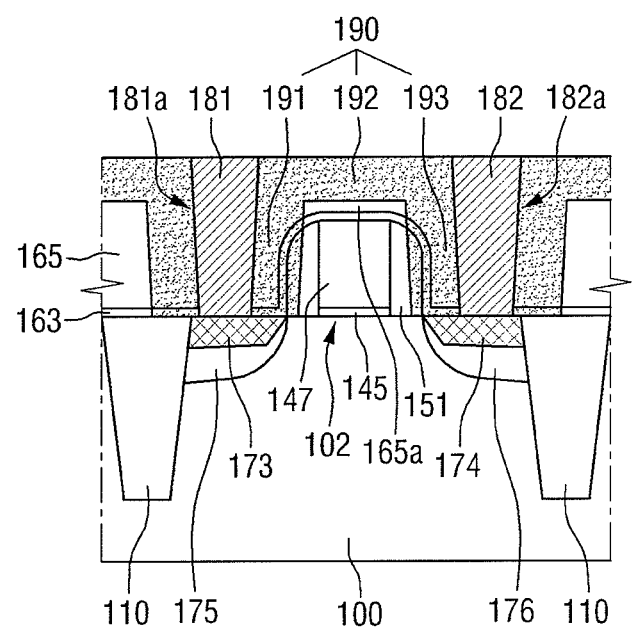
FIG. 2 is a cross-sectional view of a semiconductor device 2 according to a second embodiment of the present inventive concepts.

FIG. 2 is a cross-sectional view of a semiconductor device 2 according to a second embodiment of the present inventive concepts. For simplicity, a description of elements substantially identical to those of the above-described semiconductor device 1 according to the first embodiment of the present inventive concepts will be omitted.

Referring to FIG. 2, the semiconductor device 2 according to the second embodiment of the present inventive concepts includes a substrate 100, a transistor 102, a plurality of contacts 181 and 182, an interlayer insulating film 165, an impurity-doped region 190, and the like. The transistor 102 may include a gate insulating film 145, a gate electrode 147, a spacer 151, source/drain regions 175 and 176, silicides 173 and 174, and the like.

The silicides 173 and 174 may be formed in the source/drain regions 175 and 176, respectively. The silicides 173 and 174 may include at least one of NiSi, CoSi, and TiSi.

As will be described later, the silicides 173 and 174 may be formed before contact holes 181a and 182a are formed (or before the interlayer insulating film 165 is formed). Therefore, the silicides 173 and 174 shown in FIG. 2 are wider than the silicides 171 and 172 shown in FIG. 1.

Figure 3:
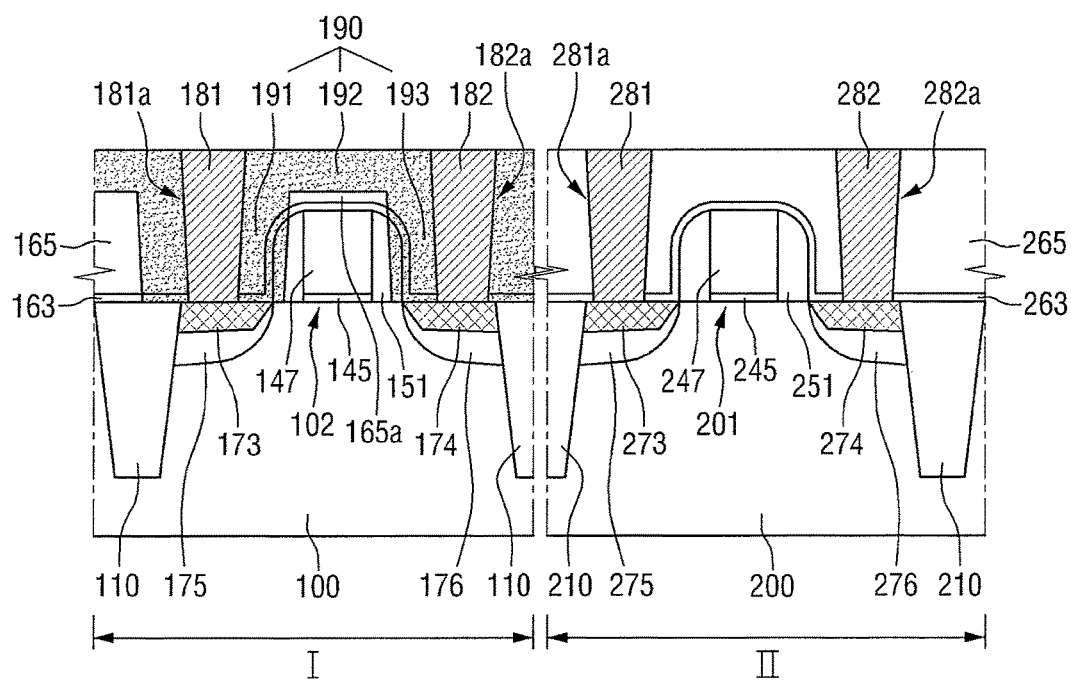
FIG. 3 is a cross-sectional view of a semiconductor device 3 according to a third embodiment of the present inventive concepts.

FIG. 3 is a cross-sectional view of a semiconductor device 3 according to a third embodiment of the present inventive concepts. For simplicity, a description of elements substantially identical to those of the above-described semiconductor device 2 according to the second embodiment of the present inventive concepts will be omitted.

Referring to FIG. 3, in the semiconductor device 3 according to the third embodiment of the present inventive concepts, a first region I and a second region II are defined in a substrate 100 and 200.

A first transistor 102 may be formed in the first region I, and a second transistor 201 may be formed in the second region II.

The first region I includes the substrate 100, the first transistor 102, a plurality of contacts 181 and 182, an interlayer insulating film 165, an impurity-doped region 190, and the like. The first transistor 102 may include a gate insulating film 145, a gate electrode 147, a spacer 151, source/drain regions 175 and 176, silicides 173 and 174, and the like.

The second region II includes the substrate 200, the second transistor 201, a plurality of contacts 281 and 282, an interlayer insulating film 265, and the like. The second transistor 201 may include a gate insulating film 245, a gate electrode 247, a spacer 251, source/drain regions 275 and 276, silicides 273 and 274, and the like.

That is, while the impurity-doped region 190 is formed in the first region I, no impurity-doped region may be formed in the second region II.

The first transistor 102 formed in the first region I may be a PMOS transistor, and the second transistor 201 formed in the second region II may be an n-channel metal oxide semiconductor (NMOS) transistor. As described above, fluorine may favorably affect work functions of the silicides 173 and 174 of the NMOS transistor. The fluorine, however, may adversely affect work functions of the silicides 273 and 284 of the NMOS transistor. Therefore, an impurity-doped region may not be formed in the second region II having the NMOS transistor.

Figure 4:
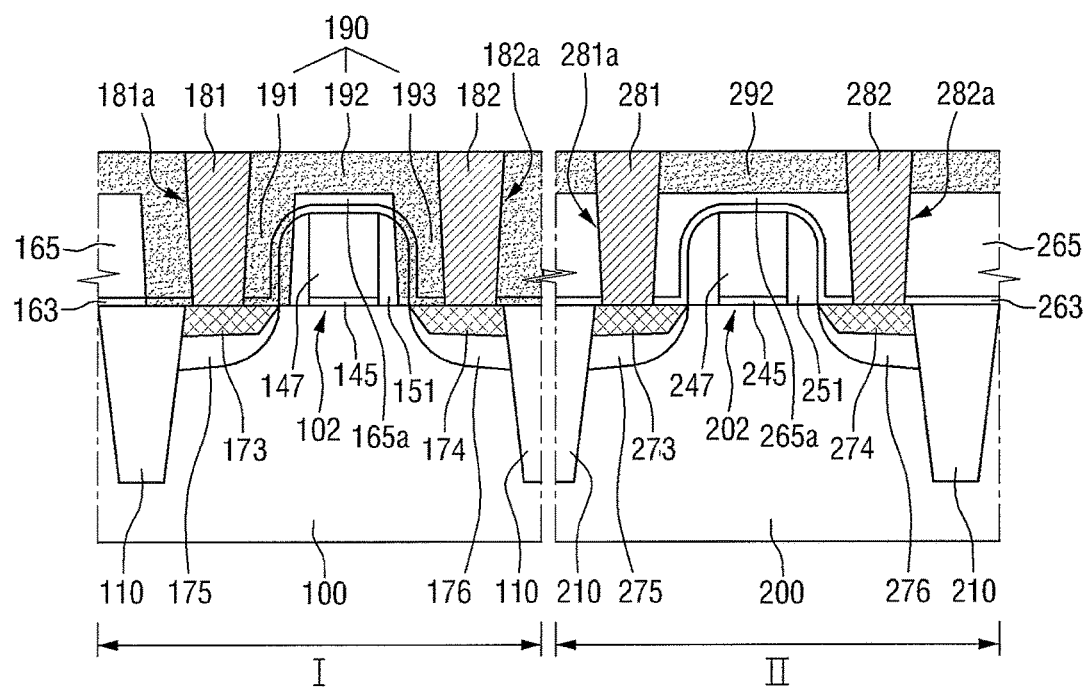
FIG. 4 is a cross-sectional view of a semiconductor device 4 according to a fourth embodiment of the present inventive concepts.

FIG. 4 is a cross-sectional view of a semiconductor device 4 according to a fourth embodiment of the present inventive concepts. For simplicity, a description of elements substantially identical to those of the above-described semiconductor device 3 according to the third embodiment of the present inventive concepts will be omitted.

Referring to FIG. 4, in the semiconductor device 4 according to the fourth embodiment of the present inventive concepts, a first region I and a second region II are defined in a substrate 100 and 200. A transistor 102 formed in the first region I may be a PMOS transistor, and a transistor 102 formed in the second region II may be an NMOS transistor. In the second region II, an impurity-doped region 292 may be formed only on a surface of an interlayer insulating film 265. As will be described later, impurity doping using, e.g., fluorine may be performed in a state where contact holes 181a and 182a are formed in the first region I while contact holes 281a and 282a are not formed in the second region II. In this case, an impurity-doped region 190 may be formed along a lengthwise direction of the contact holes 181a and 182a, and the impurity-doped region 292 may be formed not along a lengthwise direction of the contact holes 281a and 282a but on the surface of the interlayer insulating film 265. That is, fluorine hardly affects the silicides 273 and 274 of the NMOS transistor.

Figure 5:
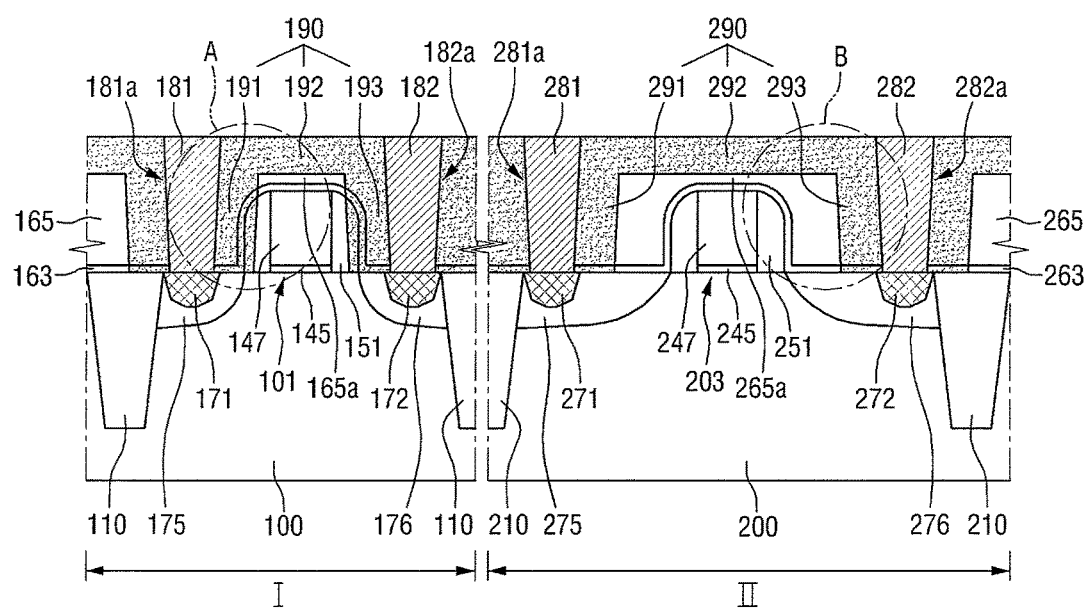
FIG. 5 is a cross-sectional view of a semiconductor device 5 according to a fifth embodiment of the present inventive concepts.
Figure 6:
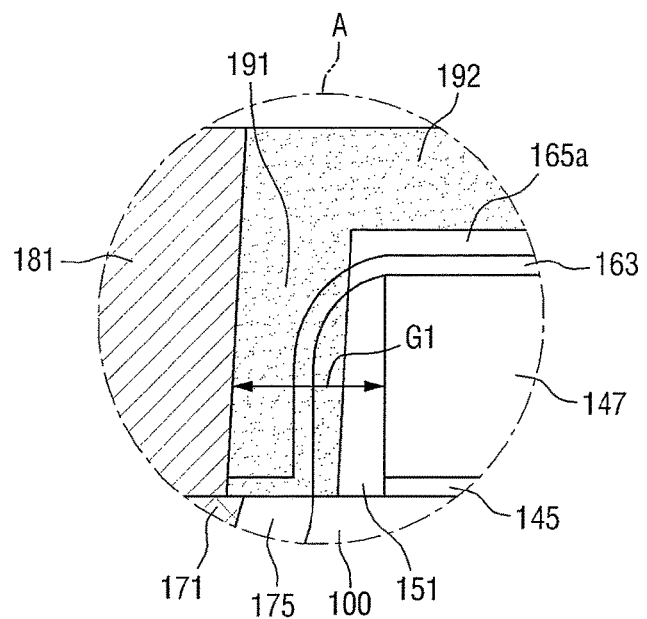
FIG. 6 is an enlarged view of a region 'A', shown in FIG. 5.
Figure 7:
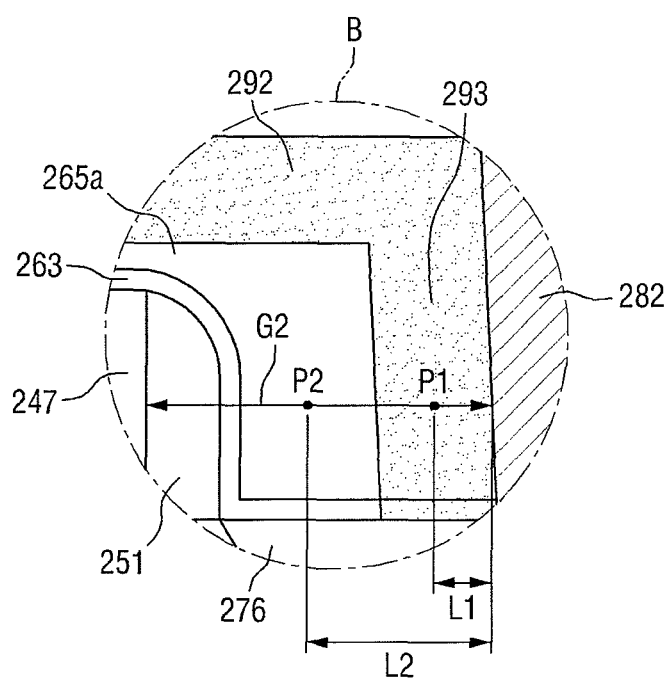
FIG. 7 is an enlarged view of a region 'B', shown in FIG. 5.

FIG. 5 is a cross-sectional view of a semiconductor device 5 according to a fifth embodiment of the present inventive concepts. FIG. 6 is an enlarged view of a region 'A,' shown in FIG. 5. FIG. 7 is an enlarged view of a region 'B,' shown in FIG. 5. For simplicity, a description of elements substantially identical to those of the above-described semiconductor device 1 according to the first embodiment of the present inventive concepts will be omitted.

Referring to FIGS. 5 through 7, in the semiconductor device 5 according to the fifth embodiment of the present inventive concepts, a first region I and a second region II are defined in a substrate 100 and 200.

A first transistor 101 may be formed in the first region I, and a second transistor 203 may be formed in the second region II.

The first region I includes the substrate 100, the first transistor 102, a plurality of contacts (i.e., first and second contacts 181 and 182), an interlayer insulating film 165, an impurity-doped region 190, and the like. The first transistor 102 may include a gate insulating film 145, a first gate electrode 147, a spacer 151, source/drain regions 175 and 176, silicides 171 and 172, and the like.

The second region II includes the substrate 200, the second transistor 201, a plurality of contacts (i.e., third and fourth contacts 281 and 282), an interlayer insulating film 265, an impurity-doped region 290, and the like. The second transistor 201 may include a gate insulating film 245, a second gate electrode 247, a spacer 251, source/drain regions 275 and 276, silicides 271 and 272, and the like.

The impurity-doped region 290 includes a fourth impurity-doped region 291 formed around the third contact 281 and along a lengthwise direction of the third contact 281 and a fifth impurity-doped region 293 formed around the fourth contact 282 and along a lengthwise direction of the fourth contact 282. The impurity-doped region 290 may further include a sixth impurity-doped region 292 formed on a surface of the interlayer insulating film 265.

In the first region I, the first gate electrode 147 and the first contact 181 may be separated from each other by a first horizontal distance G1. In the second region II, the second gate electrode 247 and the fourth contact 282 may be separated from each other by a second horizontal distance G2. The second horizontal distance G2 may be greater than the first horizontal distance G1. Here, the horizontal distances G1 and G2 may be distances measured along a plane parallel to the substrate 100 and 200.

The first region I may be a core region, and the second region II may be an input/output (I/O) region.

Therefore, as shown in the drawings, a portion of a first impurity-doped region 191 and a portion of a second impurity-doped region 193 may overlap the spacer 151. However, the fourth impurity-doped region 291 and the fifth impurity-doped region 293 may not overlap the spacer 251.

Specifically, referring to FIG. 7, a first position P1 and a second position P2 are defined in the interlayer insulating film 265. The first position P1 is separated from a contact (e.g., the fourth contact 282) by a first length L1 in a direction of the gate electrode 247, and the second position P2 is separated from the contact (e.g., the fourth contact 282) by a second length L2, which is greater than the first length L1, in the direction of the gate electrode 247. The first position P1 may be located in the impurity-doped region 293, and the second position P2 may be located in an undoped region 265a. As described above, a dielectric constant of the impurity-doped region 290 may be smaller than that of the undoped region 265a. Therefore, a dielectric constant at the position P1 may be smaller than a dielectric constant at the second position P2.

Therefore, an average value of dielectric constants of insulating films between a contact 181, 182, 281 or 282 and a gate electrode 147 or 247 may vary according to the distance between the contact 181, 182, 281 or 282 and the gate electrode 147 or 247.

Specifically, referring to FIG. 6, the impurity-doped region 191 and the spacer 151 may be located between a contact (e.g., 181) and the gate electrode 147. A first average dielectric constant of the insulating films between the contact 181 and the gate electrode 147 may be obtained by calculating the average of a dielectric constant of the impurity-doped region 191 and a dielectric constant of the spacer 151.

On the other hand, referring to FIG. 7, the impurity-doped region 293, the undoped region 265a of the interlayer insulating film 265, and the spacer 251 may be located between a contact (e.g., contact 282) and the gate electrode 247. A second average dielectric constant of the insulating films between the contact 282 and the gate electrode 247 may be obtained by calculating and averaging a dielectric constant of the impurity-doped region 293, the dielectric constant of the undoped region 265a, and a dielectric constant of the spacer 251.

The first average dielectric constant may be smaller than the second average dielectric constant because the dielectric constant of the impurity-doped region 293 may be smaller than that of the undoped region 265a.

Figure 8:
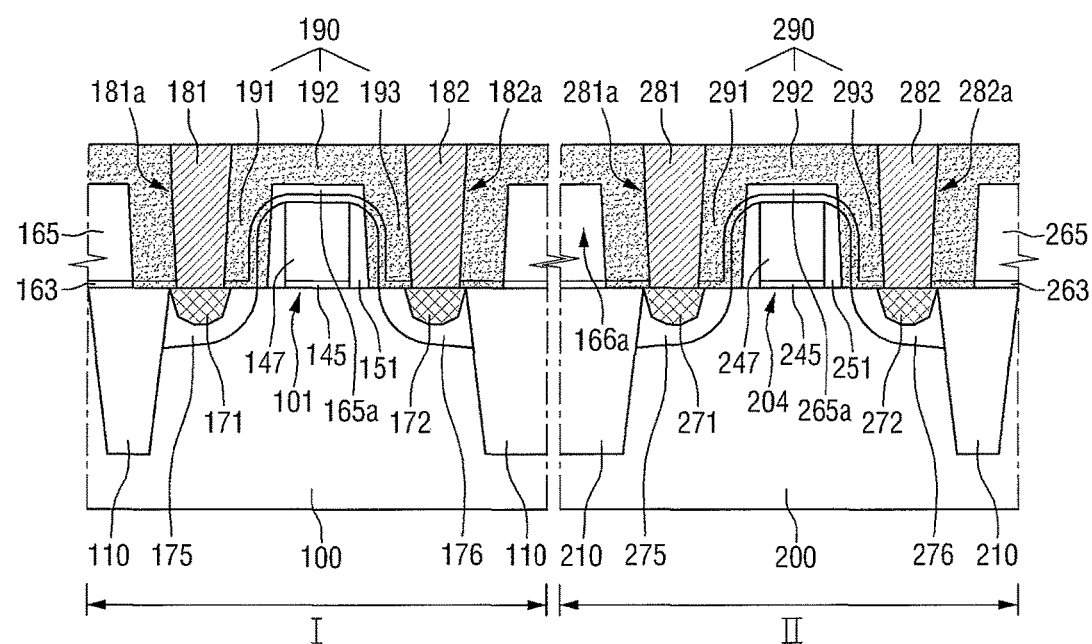
FIG. 8 is a cross-sectional view of a semiconductor device 6 according to a sixth embodiment of the present inventive concepts.

FIG. 8 is a cross-sectional view of a semiconductor device 6 according to a sixth embodiment of the present inventive concepts. For simplicity, a description of elements substantially identical to those of the above-described semiconductor device 1 according to the first embodiment of the present inventive concepts will be omitted.

Referring to FIG. 8, in the semiconductor device 6 according to the sixth embodiment of the present inventive concepts, a first region I and a second region II are defined in a substrate 100 and 200.

A first transistor 101 may be formed in the first region I, and a second transistor 204 may be formed in the second region II. An impurity-doped region 190 is formed in the first region I, and an impurity-doped region 290 is formed in the second region II.

When element isolation regions 110 and 210 are wide, they may be located under an undoped region 166a.

Figure 9:
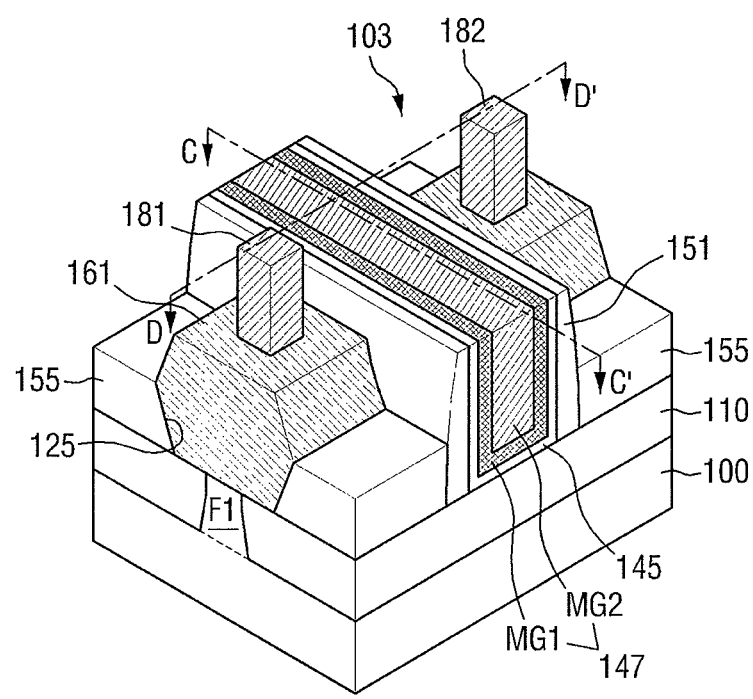
FIG. 9 is a perspective view of a semiconductor device 7 according to a seventh embodiment of the present inventive concepts.
Figure 10:
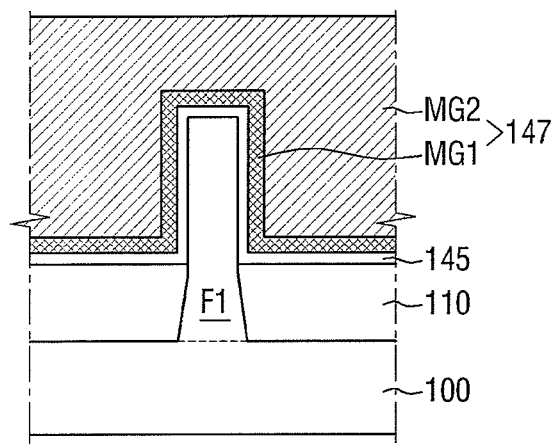
FIG. 10 is a cross-sectional view taken along the line C-C of FIG. 9.
Figure 11:
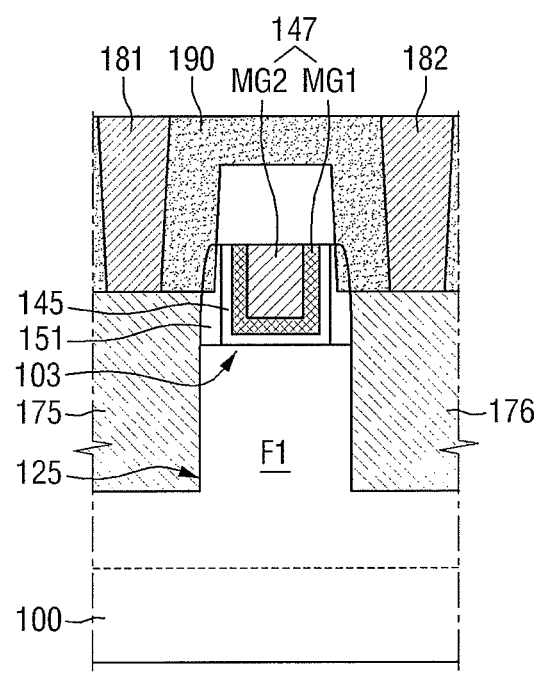
FIG. 11 is a cross-sectional view taken along the line D-D of FIG. 9.

FIG. 9 is a perspective view of a semiconductor device 7 according to a seventh embodiment of the present inventive concepts. FIG. 10 is a cross-sectional view taken along the line C-C of FIG. 9. FIG. 11 is a cross-sectional view taken along the line D-D of FIG. 9. In FIG. 9, an interlayer insulating film and an impurity-doped region are not shown.

Referring to FIGS. 9 through 11, in the semiconductor device 7 according to the seventh embodiment of the present inventive concepts, a first fin-type transistor 103 may include a first fin F1, a first gate electrode 147, a first recess 125, first source/drain regions 175 and 176, and the like.

The first fin F1 may extend along a second direction Y1. The first fin F1 may be a portion of a substrate 100 and may include an epitaxial layer grown from the substrate 100. An element isolation film 110 may cover side surfaces of the first fin F1.

The first gate electrode 147 may be formed on the first fin F1 to cross the first fin F1. The first gate electrode 147 may extend in a first direction X1.

The first gate electrode 147 may include first and second metal layers MG1 and MG2. As shown in the drawings, the first gate electrode 147 may be formed by stacking two or more metal layers MG1 and MG2. The first metal layer MG1 controls a work function, and the second metal layer MG2 fills a space formed by the first metal layer MG1. The first metal layer MG1 may include at least one of TiN, TaN, TiC, and TaC. In addition, the second metal layer MG2 may include W or Al. Alternatively, the first gate electrode 147 may be made of a material such as Si or SiGe, instead of metal. The first gate electrode 147 may be formed by a replacement process. However, the present inventive concepts are not limited thereto.

A first gate insulating film 145 may be formed between the first fin F1 and the first gate electrode 147. The first gate insulating film 145 may be formed on a top surface and side surfaces of the first fin F1. In addition, the first gate insulating film 145 may be disposed between the first gate electrode 147 and the element isolation film 110. The first gate insulating film 145 may be made of a high-k material having a higher dielectric constant than a silicon oxide film. The first gate insulating film 145 may include, e.g., $HfO_2$, $ZrO_2$, or $Ta_2O_5$.

The first recess 125 may be formed in the first fin F1 on both sides of the first gate electrode 147. The first recess 125 may have sloping sidewalls. The first recess 125 may become wider as the distance from the substrate 100 increases. The first recess 125 may be wider than the first fin F1.

The first source/drain regions 175 and 176 are formed in the first recess 125. The first source/drain regions 175 and 176 may be elevated source/drain regions. That is, top surface of the first source/drain regions 175 and 176 may be higher than a bottom surface of a first interlayer insulating film 165. In addition, the first source/drain regions 175 and 176 may be insulated from the first gate electrode 147 by a spacer 151.

When the first fin-type transistor 103 is a PMOS transistor, the first source/drain regions 175 and 176 may include a compressive stress material. The compressive stress material may have a lattice constant that is greater than that of Si. The compressive stress material may be, for example, SiGe. The compressive stress material may improve carrier mobility in a channel region by applying compressive stress to the first fin F1.

The spacer 151 may include at least one of a nitride film and an oxynitride film.

The first interlayer insulating film 165 may be formed on the substrate 100 to cover the first fin-type transistor 103 and a plurality of contacts 181 and 182. The first interlayer insulating film 165 may be made of a material such as SiN or $SiO_2$.

An impurity-doped region 190 may be formed around the contacts 181 and 182 in the first interlayer insulating film 165 and along a lengthwise direction of the contacts 181 and 182. The impurity-doped region 190 may include at least one of fluorine and carbon.

A method of fabricating the semiconductor device 1 according to the first embodiment of the present inventive concepts will now be described with reference to FIGS. 12 through 15 and 1. FIGS. 12 through 15 are cross-sectional views illustrating intermediate processes included in a method of fabricating the semiconductor device 1 according to the first embodiment of the present inventive concepts.

Figure 12:
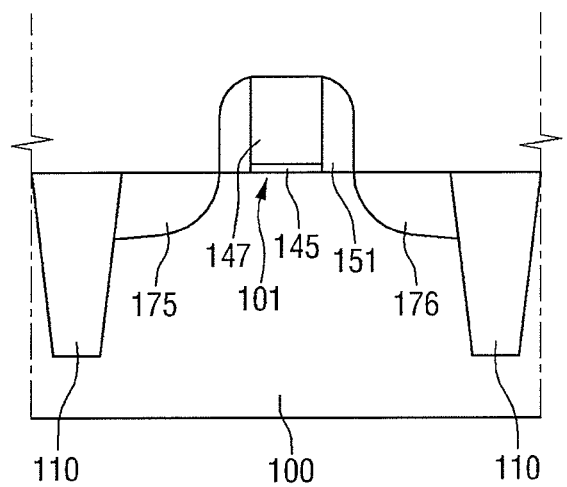
FIGS. 12 through 15 are cross-sectional views illustrating intermediate processes included in a method of fabricating the semiconductor device 1 according to the first embodiment of the present inventive concepts.

Referring to FIG. 12, an element isolation region 110 is formed in a substrate 100 to define an active region. A transistor 101 is formed in the active region. The transistor 101 may include a gate insulating film 145, a gate electrode 147, a spacer 151, and source/drain regions 175 and 176. As shown in FIG. 12, silicides 171 and 172 (see FIG. 1) are not formed. The transistor 101 may be a PMOS transistor.

Figure 13:
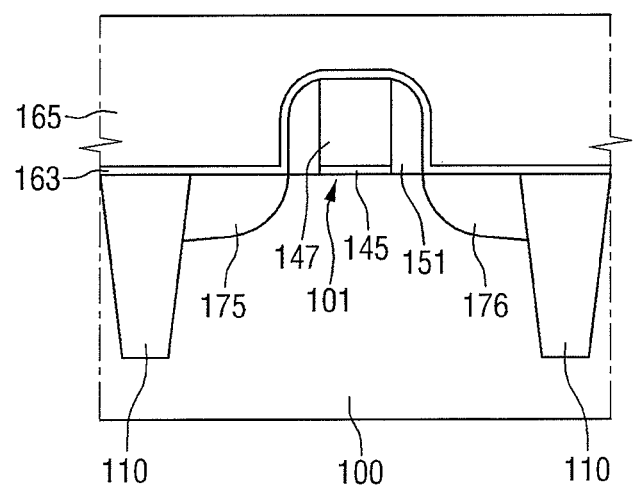

Referring to FIG. 13, an etch stop film 163 and an interlayer insulating film 165 are formed on the substrate 100. The interlayer insulating film 165 may be made of a material such as SiN or $SiO_2$.

Figure 14:
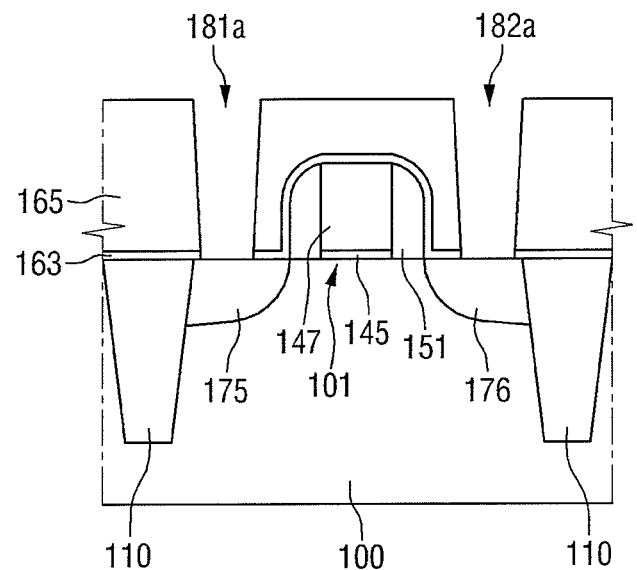

Referring to FIG. 14, a plurality of contact holes 181a and 182a are formed in the interlayer insulating film 165.

Figure 15:
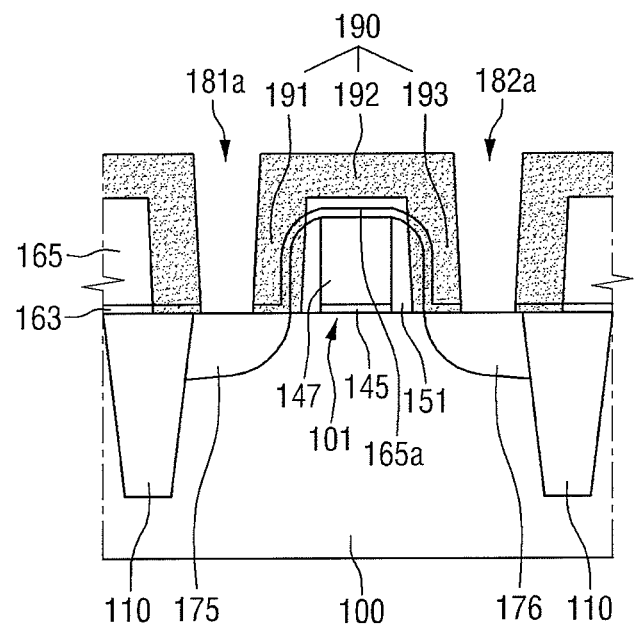

Referring to FIG. 15, an impurity-doped region 190 is formed around the contact holes 181a and 182a in the interlayer insulating film 165 and along a lengthwise direction of the contact holes 181a and 182a.

The impurity-doped region 190 may include at least one of fluorine and carbon.

The impurity-doped region 190 may be formed using an ion implantation process. For example, conditions under which the ion implantation process is performed may include an energy of 1 to 10 keV, an energy dose of 1e14 to 2e16 $cm^{-2}$ per step, and a tilt angle of 0 to 30 degrees.

Alternatively, the impurity-doped region 190 may be formed using a plasma doping process.

The fabrication method may further include drive-in annealing after the forming of the impurity-doped region 190.

A dielectric constant of the impurity-doped region 190 may be smaller than that of an undoped region 165a. If a region of the interlayer insulating film 165 is doped with impurities, such as fluorine or carbon, the dielectric constant of the impurity-doped region is reduced.

Referring back to FIG. 1, the silicides 171 and 172 may be formed in portions of the source/drain regions 175 and 176 that are exposed by the contact holes 181a and 182a. As shown in FIG. 1, the silicides 171 and 172 may be formed so as to not be overlapped by the spacer 151. The silicides 171 and 172 may include at least one of NiSi, CoSi, and TiSi.

Finally, contacts 181 and 182 are formed to fill the contact holes 181a and 182a, thereby completing the fabrication of the semiconductor device 1 according to the first embodiment of the present inventive concepts.

A method of fabricating the semiconductor device 2 according to the second embodiment of the present inventive concepts will now be described with reference to FIGS. 16 through 19 and 2. FIGS. 16 through 19 are cross-sectional views illustrating intermediate processes included in the method of fabricating the semiconductor device 2 according to the second embodiment.

Figure 16:
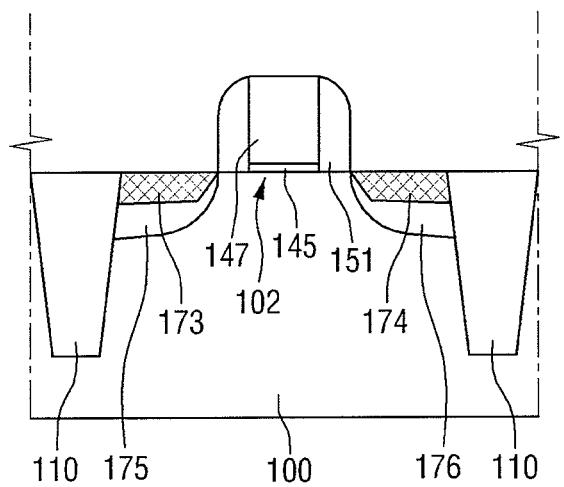
FIGS. 16 through 19 are cross-sectional views illustrating intermediate processes included in a method of fabricating the semiconductor device 2 according to the second embodiment of the present inventive concepts.

Referring to FIG. 16, an element isolation region 110 is formed in a substrate 100 to define an active region. A transistor 102 is formed in the active region. The transistor 101 may include a gate insulating film 145, a gate electrode 147, a spacer 151, source/drain regions 175 and 176, and silicides 173 and 174. The transistor 101 may be a PMOS transistor.

Figure 17:
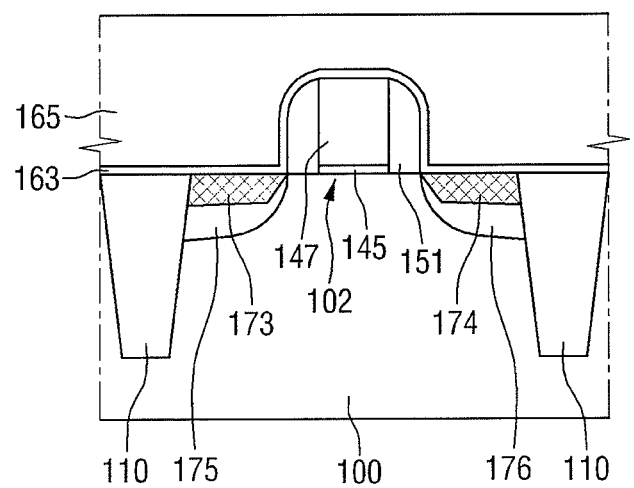

Referring to FIG. 17, an etch stop film 163 and an interlayer insulating film 165 are formed on the substrate 100.

Figure 18:
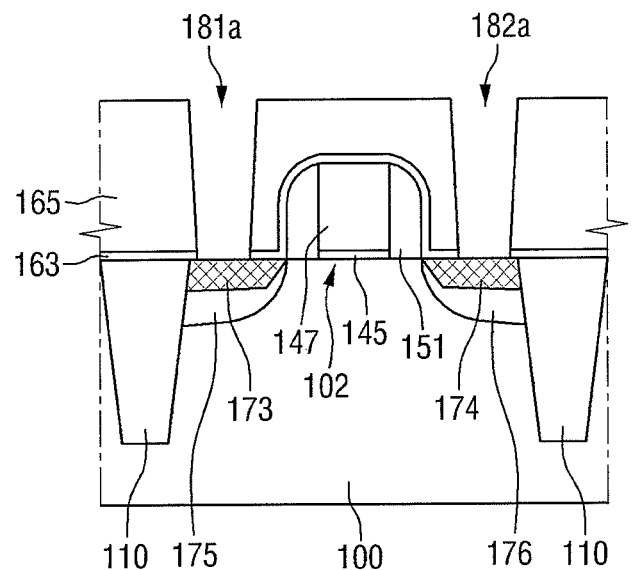

Referring to FIG. 18, a plurality of contact holes 181a and 182a are formed in the interlayer insulating film 165.

Figure 19:
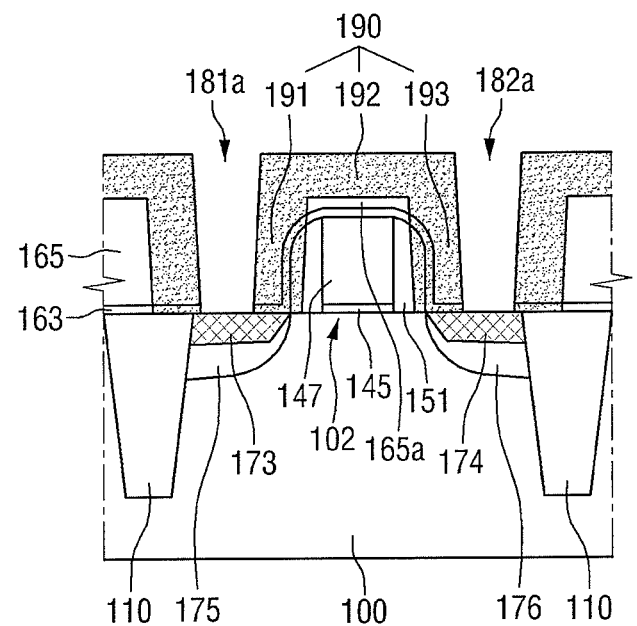

Referring to FIG. 19, an impurity-doped region 190 is formed around the contact holes 181a and 182a in the interlayer insulating film 165 and along a lengthwise direction of the contact holes 181a and 182a.

Referring to FIG. 2, contacts 181 and 182 are formed to fill the contact holes 181a and 182a, thereby completing the fabrication of the semiconductor device 2 according to the second embodiment of the present inventive concepts.

A method of fabricating the semiconductor device 3 according to the third embodiment of the present inventive concepts will now be described with reference to FIGS. 20 through 23 and 3. FIGS. 20 through 23 are cross-sectional views illustrating intermediate processes included in the method of fabricating the semiconductor device 3 according to the third embodiment.

Figure 20:
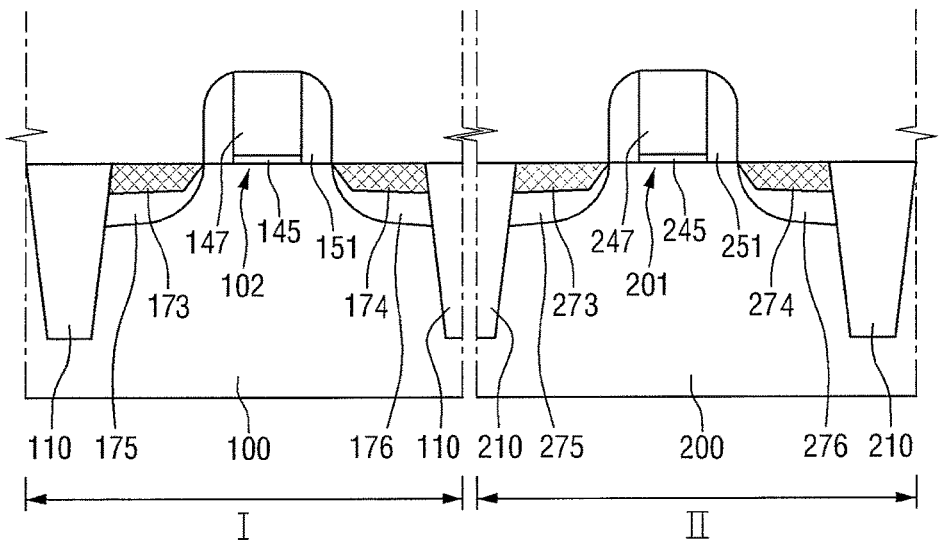
FIGS. 20 through 23 are cross-sectional views illustrating intermediate processes included in a method of fabricating the semiconductor device 3 according to the third embodiment of the present inventive concepts.

Referring to FIG. 20, a first region I and a second region II are defined in a substrate 100 and 200. A first transistor 102 is formed in the first region I, and a second transistor 201 may be formed in the second region II. The first transistor 101 may be a PMOS transistor, and the second transistor 201 may be an NMOS transistor.

Figure 21:
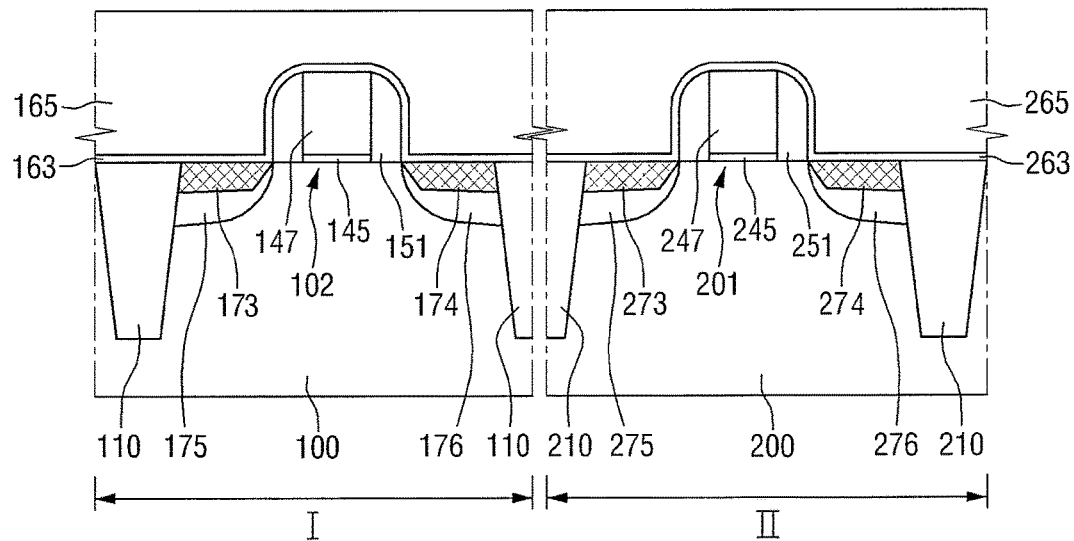

Referring to FIG. 21, an etch stop film 163 and 263 and an interlayer insulating film 165 and 265 are formed on the substrate 100 and 200.

Figure 22:
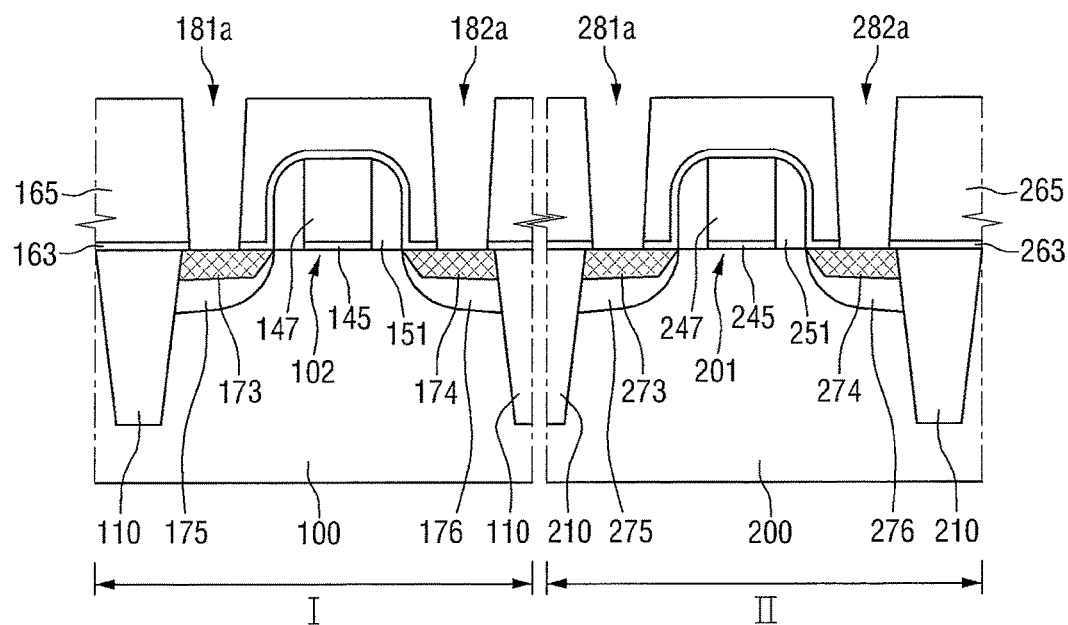

Referring to FIG. 22, a plurality of contact holes 181a, 182a, 281a and 282a are formed in the interlayer insulating film 165 and 265.

Figure 23:
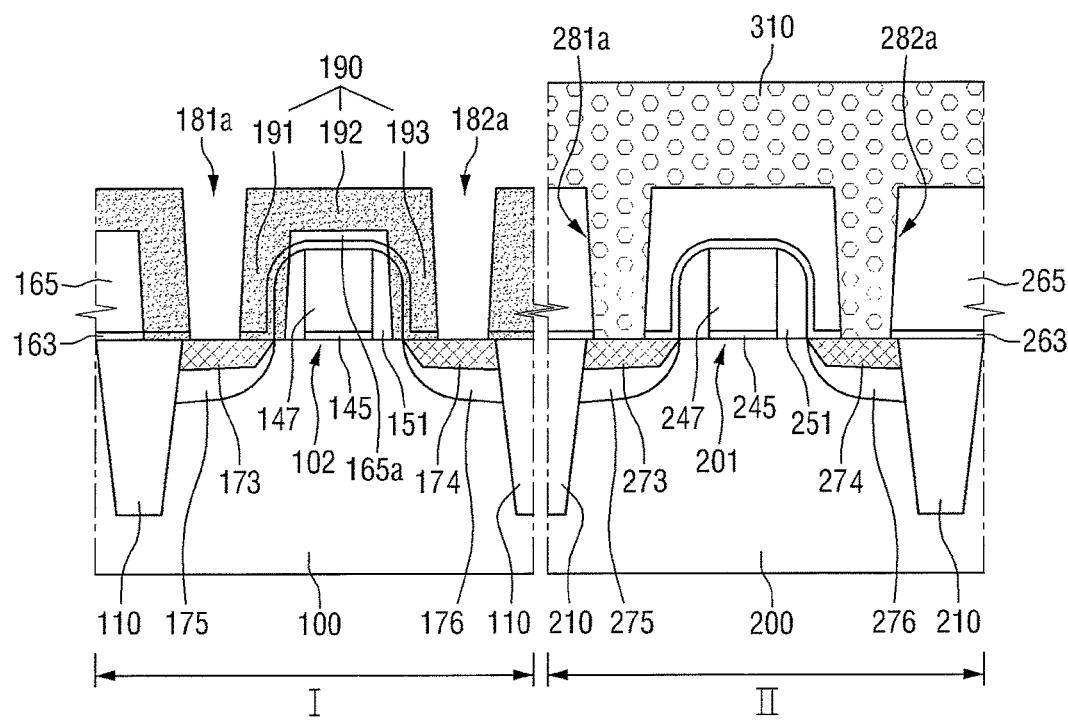

Referring to FIG. 23, a mask 310 that covers the second region II and exposes the first region I is formed.

An impurity-doped region 190 is formed around the contact holes 181a and 182a in the interlayer insulating film 165 and along a lengthwise direction of the contact holes 181a and 182a.

Referring to FIG. 3, after the mask 310 is removed, contacts 181, 182, 281 and 282 are formed to fill the contact holes 181a, 182a, 281a and 282a, thereby completing the fabrication of the semiconductor device 3 according to the third embodiment of the present inventive concepts.

In FIG. 23, the impurity-doped region 190 is formed after the mask 310 is formed because fluorine can adversely affect work functions of silicides 273 and 274 of the NMOS transistor, although it favorably affects work functions of silicides 173 and 174 of the PMOS transistor.

Figure 24:
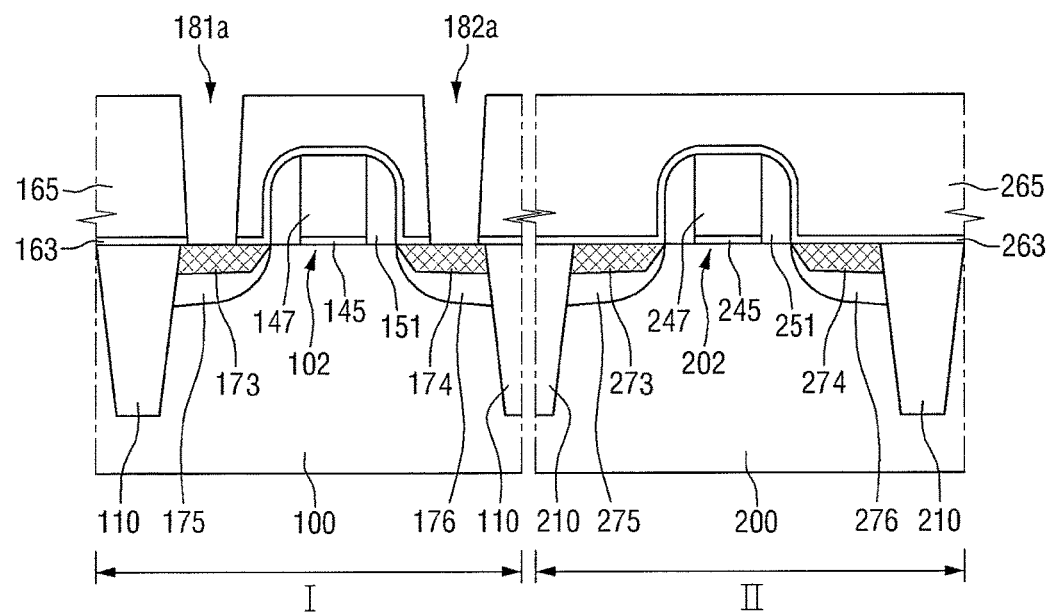
FIGS. 24 through 26 are cross-sectional views illustrating intermediate processes included in a method of fabricating the semiconductor device 4 according to the fourth embodiment of the present inventive concepts.
Figure 25:
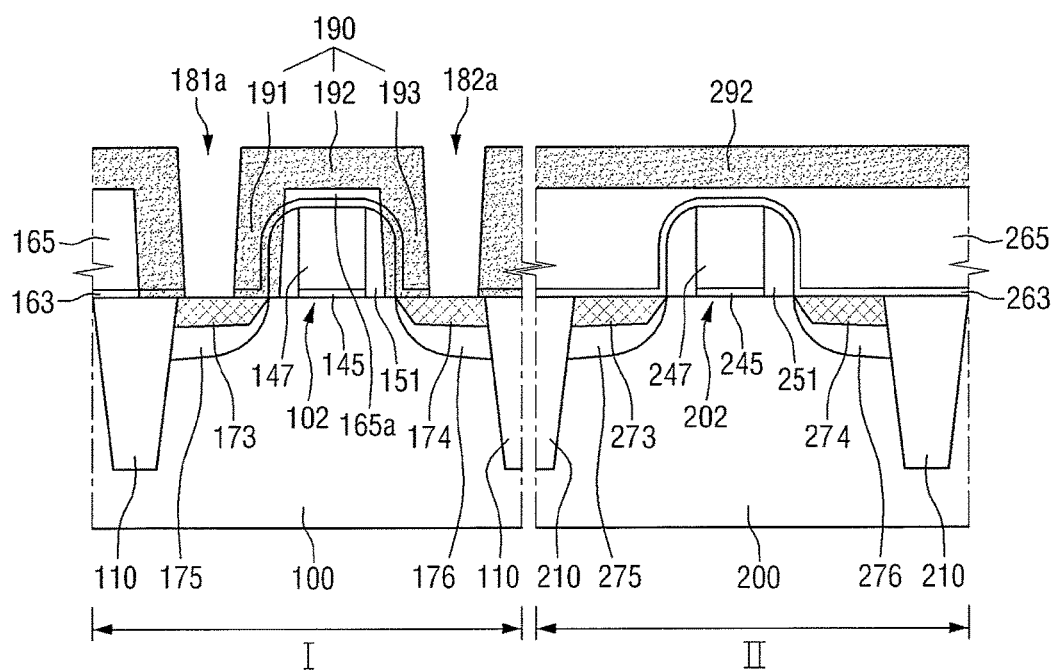
Figure 26:
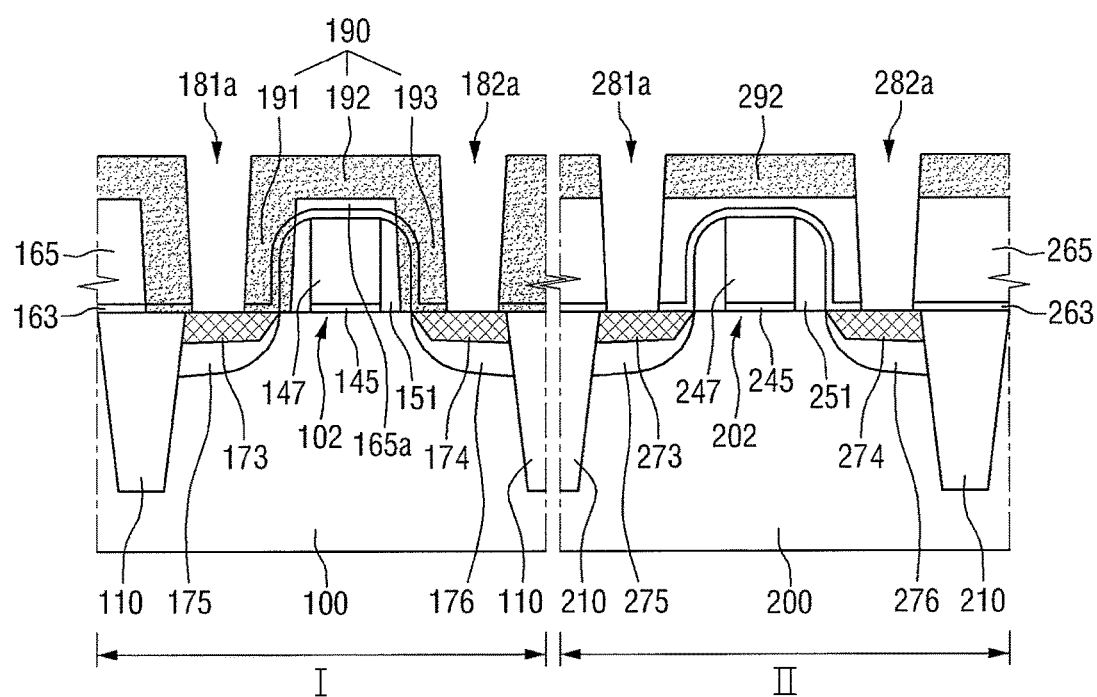

A method of fabricating the semiconductor device 4 according to the fourth embodiment of the present inventive concepts will now be described with reference to FIGS. 24 through 26 and 4. FIGS. 24 through 26 are cross-sectional views illustrating intermediate processes included in the method of fabricating the semiconductor device 4 according to the fourth embodiment.

Referring to FIG. 24, a first region I and a second region II are defined in a substrate 100 and 200. A first transistor 102 may be formed in the first region I, and a second transistor 202 may be formed in the second region II. The first transistor 102 may be a PMOS transistor, and the second transistor 202 may be an NMOS transistor.

An interlayer insulating film 165 and 265 is formed on the substrate 100 and 200.

Then, a plurality of contact holes 181a and 182a are formed in the interlayer insulating film 165 of the first region I using a mask (not shown) which covers the second region II and exposes the first region I. That is, the contact holes 181a and 182a may be formed in the first region I, and contact holes 281a and 282a may not be formed in the second region II.

Referring to FIG. 25, impurity-doped regions 190 and 292 are formed by impurity doping. Specifically, the impurity-doped region 190 formed in the first region I may include a first impurity-doped region 191, a second impurity-doped region 193, and a third impurity-doped region 192.

However, the impurity-doped region 292 formed in the second region II may be formed only on a surface of the interlayer insulating film 265.

Referring to FIG. 26, the contact holes 281a and 282a are formed in the interlayer insulating film 265 of the second region II.

Referring to FIG. 4, contacts 181, 182, 281 and 282 are formed to fill the contact holes 181a, 182a, 281a and 282a, thereby completing the semiconductor device 4 according to the fourth embodiment of the present inventive concepts.

In FIG. 25, the impurity-doped region 190 is formed after the contact holes 181a and 182a are formed only in the interlayer insulating film 165 of the first region I. Therefore, the impurity-doped region 292 is formed only on the surface of the interlayer insulating film 265 of the second region II. Therefore, fluorine may scarcely affect silicides 273 and 274 of the NMOS transistor.

Figure 27:
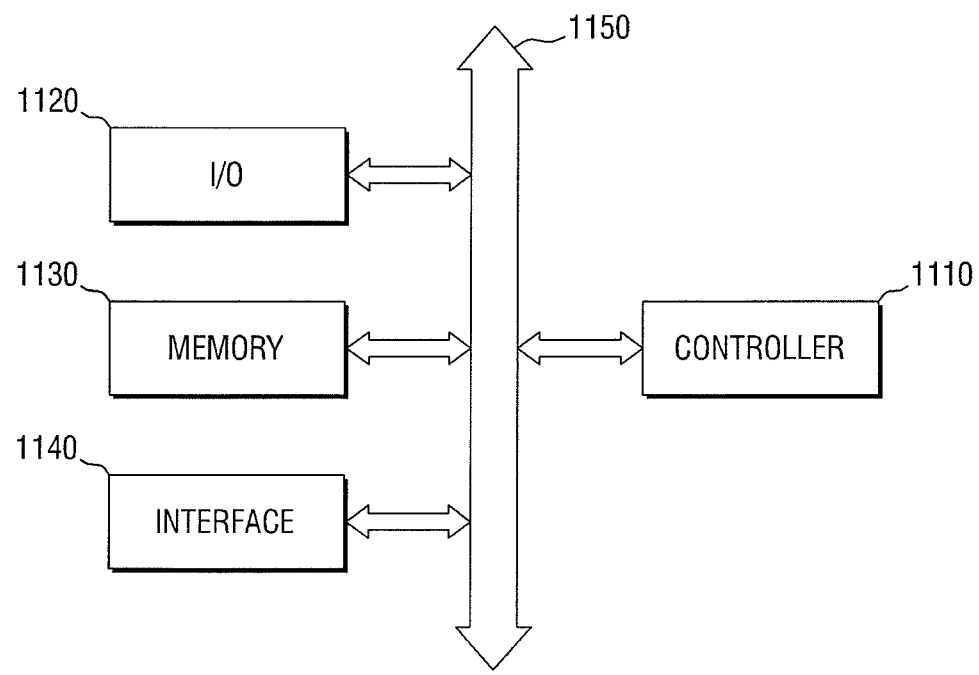
FIG. 27 is a block diagram of an electronic system 1100 including a semiconductor device according to some embodiments of the present inventive concepts.

FIG. 27 is a block diagram of an electronic system 1100 including a semiconductor device according to some embodiments of the present inventive concepts.

Referring to FIG. 27, the electronic system 1100 according to an embodiment of the present inventive concepts may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data is transferred.

The controller 1110 may include at least one of a microprocessor, a digital signal processor, a microcontroller, or logic elements capable of performing similar functions to those of the above elements. The I/O device 1120 may include a keypad, a keyboard, and a display device. The memory device 1130 may store data and/or commands. The interface 1140 may transmit data to a communication network or receive data from the communication network. The interface 1140 can be in a wired or wireless form. For example, the interface 1140 may be an antenna or a wired/wireless transceiver. Although not shown in FIG. 27, the electronic system 1100 may further include a high-speed dynamic random access memory (DRAM) and/or a high-speed static random access memory (SRAM) as an operation memory for improving the operation of the controller 1110. A fin field effect transistor according to embodiments of the present inventive concepts may be provided within the memory device 1130 or provided as a part of the controller 1110 or the I/O device 1120.

The electronic system 1100 can be employed in a personal digital assistant (PDA), a portable computer, a web tablet, a wireless phone, a mobile phone, a digital music player, a memory card, and all electronic products that can transmit and/or receive information in a wireless environment.

Figure 28:
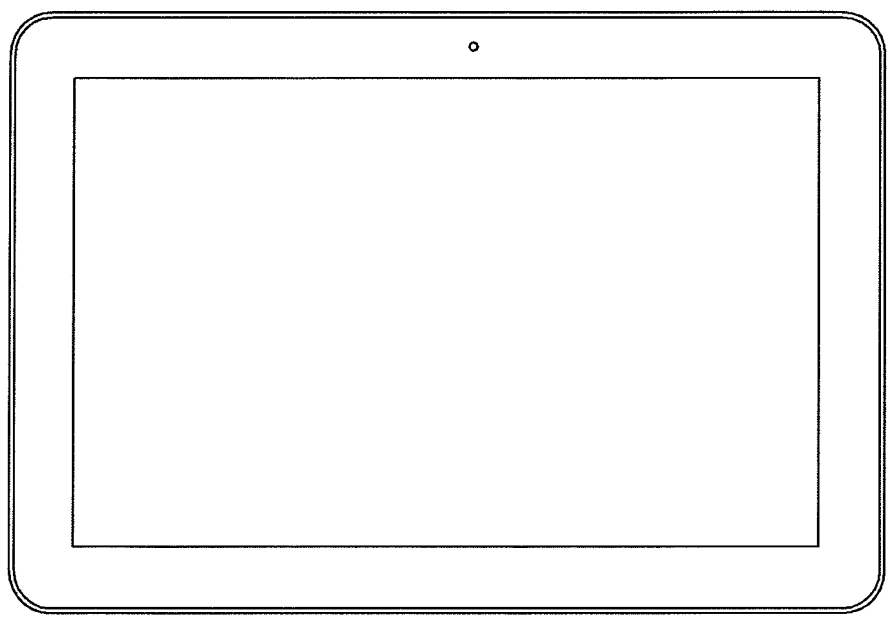
FIGS. 28 and 29 are example semiconductor systems to which semiconductor devices according to some embodiments of the present inventive concepts can be applied.
Figure 29:
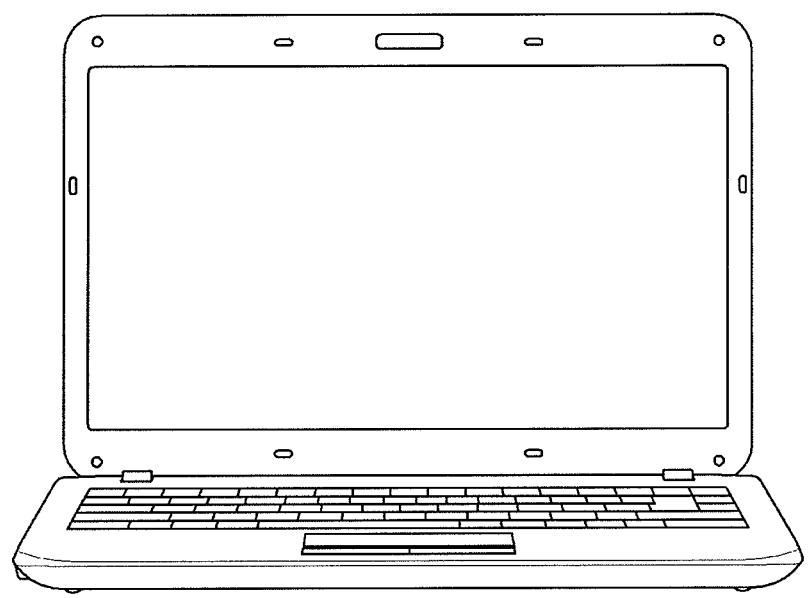

FIGS. 28 and 29 are example semiconductor systems in which semiconductor devices according to some embodiments of the present inventive concepts can be employed. FIG. 28 shows a tablet PC, and FIG. 29 shows a notebook computer. At least one of the above-described semiconductor devices 1 through 7 according to the embodiments of the present inventive concepts can be used in a table PC, a notebook computer, and the like. The semiconductor devices according to the embodiments of the present inventive concepts can likewise be employed in other integrated circuit devices not shown in the drawings.

In concluding the detailed description, those skilled in the art will appreciate that many variations and modifications can be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device comprising:
   a substrate on which an active region is defined;
   a fin protruding from the substrate on the active region;
   a gate electrode covering an upper surface and both side surfaces of the fin;
   a contact spaced apart from the gate electrode in one direction; and
   an interlayer insulating film formed on the substrate,
   wherein an impurity concentration of the interlayer insulating film around the contact and an impurity concentration of the interlayer insulating film around a top surface of the gate electrode are different from each other,
   wherein the interlayer insulating film comprises an impurity-doped region formed around the contact and along a lengthwise direction of the contact, and an undoped region, and
   wherein an upper surface of the impurity-doped region is coplanar with an upper surface of the contact.

2. The semiconductor device of claim 1,
   wherein the undoped region vertically overlaps the gate electrode, and wherein the impurity-doped region covers the undoped region.

3. The semiconductor device of claim 1, further comprising a spacer covering both sidewalls of the gate electrode, wherein the impurity-doped region vertically overlaps the spacer.

4. The semiconductor device of claim 3, wherein the undoped region is in contact with the gate electrode and the spacer.

5. The semiconductor device of claim 1, wherein a dielectric constant of the impurity-doped region is smaller than that of the undoped region.

6. The semiconductor device of claim 1, wherein the impurity-doped region has a composition different from a composition of a material of the undoped region.

7. The semiconductor device of claim 1, wherein the impurity-doped region comprises at least one of fluorine and carbon.

8. The semiconductor device of claim 1, further comprising a source/drain disposed on both sides of the gate electrode, wherein the contact is connected to the source/drain.

9. The semiconductor device of claim 1, further comprising a spacer covering both sidewalls of the gate electrode, wherein the undoped region contacts a top surface of the spacer.

10. A semiconductor device comprising:
a substrate on which an active region is defined;
a fin protruding from the substrate on the active region;
a gate electrode covering an upper surface and both side surfaces of the fin;
a contact spaced apart from the gate electrode in one direction; and
a layer having an impurity-doped region contacting a sidewall of the contact and an undoped region contacting a top surface of the gate electrode,
wherein an upper surface of the impurity-doped region is coplanar with an upper surface of the contact.

11. The semiconductor device of claim 10, further comprising a spacer covering both sidewalls of the gate electrode.

12. The semiconductor device of claim 11, wherein the impurity-doped region vertically overlaps the spacer.

13. The semiconductor device of claim 11, wherein the undoped region contacts a top surface of the spacer.

14. The semiconductor device of claim 10, wherein a dielectric constant of the impurity-doped region is smaller than that of the undoped region.

15. The semiconductor device of claim 10, wherein the impurity-doped region has a composition different from a composition of a material of the undoped region.

16. The semiconductor device of claim 10, wherein the impurity-doped region comprises at least one of fluorine and carbon.

17. The semiconductor device of claim 10, further comprising a source/drain disposed on both sides of the gate electrode, wherein the contact is connected to the source/drain.

* * * * *